US011972455B2

(12) United States Patent
Korada et al.

(10) Patent No.: US 11,972,455 B2
(45) Date of Patent: Apr. 30, 2024

(54) ADAPTIVE REAL TIME MODELING AND SCORING

(71) Applicant: Zeta Global Corp., New York, NY (US)

(72) Inventors: Pavan Korada, San Rafael, CA (US); Sunpreet Singh Khanuja, San Jose, CA (US); Yun Sam Chong, Santa Clara, CA (US); Bharat Goyal, San Jose, CA (US); Edward Robert Rau, Jr., Riverbank, CA (US)

(73) Assignee: Zeta Global Corp., New York, NY (US)

( * ) Notice: Subject to any disclaimer, the term of this patent is extended or adjusted under 35 U.S.C. 154(b) by 0 days.

(21) Appl. No.: 17/538,647

(22) Filed: Nov. 30, 2021

(65) Prior Publication Data

US 2022/0092635 A1    Mar. 24, 2022

Related U.S. Application Data

(63) Continuation of application No. 15/594,284, filed on May 12, 2017, now Pat. No. 11,227,304.

(60) Provisional application No. 62/336,514, filed on May 13, 2016.

(51) Int. Cl.
*G06F 16/2457* (2019.01)
*G06F 16/9535* (2019.01)
(Continued)

(52) U.S. Cl.
CPC ... *G06Q 30/0243* (2013.01); *G06F 16/24578* (2019.01); *G06F 16/9535* (2019.01);
(Continued)

(58) Field of Classification Search
CPC ............ G06Q 30/016; G06Q 30/0243; G06Q 30/0251; G06F 16/9535; G06F 16/24578
See application file for complete search history.

(56) References Cited

U.S. PATENT DOCUMENTS 6,792,399 B1    9/2004  Phillips et al.
7,003,476 B1    2/2006  Samra et al.
(Continued)

OTHER PUBLICATIONS

"U.S. Appl. No. 15/594, 104, Advisory Action dated Mar. 9, 2020", 5 pgs.

(Continued)

*Primary Examiner* — Rehana Perveen
*Assistant Examiner* — Cuong V Luu
(74) *Attorney, Agent, or Firm* — Schwegman Lundberg & Woessner, P.A.

(57) ABSTRACT

Systems, methods and media for adaptive real time modeling and scoring are provided. In one example, a system for automatically generating predictive scoring models comprises a trigger component to determine, based on a threshold or trigger, such as a detection of new significant relationships, whether a predictive scoring model is ready for a refresh or regeneration. An automated modeling sufficiency checker receives and transforms user-selectable system input data. The user-selectable system input data may comprise at least one of email, display or social media traffic. An adaptive modeling engine operably connected to the trigger component and modeling sufficiency checker is configured to monitor and identify a change in the input data and, based on an identified change in the input data, automatically refresh or regenerate the scoring model for calculating new lead scores. A refreshed or regenerated predictive scoring model is output.

20 Claims, 13 Drawing Sheets

(51) Int. Cl.
  *G06F 30/20* (2020.01)
  *G06Q 30/016* (2023.01)
  *G06Q 30/0242* (2023.01)
  *G06Q 30/0251* (2023.01)

(52) U.S. Cl.
  CPC ........... *G06F 30/20* (2020.01); *G06Q 30/016* (2013.01); *G06Q 30/0251* (2013.01)

(56) References Cited

U.S. PATENT DOCUMENTS

| | | |
|---|---|---|
| 8,271,313 B2 | 9/2012 | Williams et al. |
| 8,577,736 B2 | 11/2013 | Swinson et al. |
| 10,157,352 B1 | 12/2018 | Chan et al. |
| 10,242,068 B1 | 3/2019 | Ross et al. |
| 10,387,833 B2 | 8/2019 | Swinson et al. |
| 10,395,217 B1 | 8/2019 | Lovejoy |
| 11,144,949 B2 | 10/2021 | Korada et al. |
| 11,227,304 B2 | 1/2022 | Korada et al. |
| 2004/0103017 A1* | 5/2004 | Reed ................. G06Q 10/0637 705/14.42 |
| 2006/0242000 A1 | 10/2006 | Giguiere |
| 2007/0219848 A1 | 9/2007 | Hubsher |
| 2007/0233561 A1 | 10/2007 | Golec |
| 2007/0244741 A1 | 10/2007 | Blume et al. |
| 2008/0288361 A1 | 11/2008 | Rego et al. |
| 2009/0048859 A1 | 2/2009 | Mccarthy et al. |
| 2011/0082759 A1* | 4/2011 | Swinson ................. G06Q 30/02 705/26.1 |
| 2011/0231230 A1 | 9/2011 | Christon et al. |
| 2011/0258016 A1 | 10/2011 | Barak et al. |
| 2011/0258049 A1 | 10/2011 | Ramer et al. |
| 2011/0264479 A1 | 10/2011 | Birr |
| 2011/0276507 A1 | 11/2011 | O'Malley |
| 2011/0307382 A1 | 12/2011 | Siegel |
| 2012/0323695 A1 | 12/2012 | Stibel |
| 2013/0066676 A1 | 3/2013 | Williams et al. |
| 2014/0046880 A1 | 2/2014 | Breckenridge et al. |
| 2014/0149161 A1 | 5/2014 | Hedges et al. |
| 2014/0149178 A1 | 5/2014 | Hedges |
| 2014/0214482 A1 | 7/2014 | Williams et al. |
| 2014/0236708 A1 | 8/2014 | Wolff et al. |
| 2014/0249873 A1* | 9/2014 | Stephan ........... G06Q 10/06375 705/7.11 |
| 2014/0278981 A1* | 9/2014 | Mersov .............. G06Q 30/0255 705/14.53 |
| 2014/0316883 A1 | 10/2014 | Kitts et al. |
| 2015/0142713 A1* | 5/2015 | Gopinathan ........... G06Q 40/00 706/14 |
| 2015/0186926 A1* | 7/2015 | Chittilappilly ..... G06Q 30/0242 705/14.42 |
| 2015/0213503 A1 | 7/2015 | Friborg, Jr. |
| 2015/0248693 A1 | 9/2015 | Dubey |
| 2015/0379647 A1 | 12/2015 | Gupta et al. |
| 2016/0071117 A1 | 3/2016 | Duncan |
| 2016/0210657 A1 | 7/2016 | Chittilappilly et al. |
| 2016/0217476 A1 | 7/2016 | Duggal et al. |
| 2017/0206571 A1 | 7/2017 | Dhawan et al. |
| 2017/0300933 A1 | 10/2017 | Mascaro et al. |
| 2017/0329881 A1 | 11/2017 | Korada et al. |
| 2017/0330220 A1 | 11/2017 | Korada et al. |
| 2017/0345054 A1 | 11/2017 | Sinha et al. |
| 2018/0060744 A1 | 3/2018 | Achin et al. |
| 2019/0251593 A1 | 8/2019 | Allouche |
| 2019/0318378 A1 | 10/2019 | Korada et al. |
| 2022/0027943 A1 | 1/2022 | Korada et al. |

OTHER PUBLICATIONS

"U.S. Appl. No. 15/594,104, Final Office Action dated Jan. 2, 2020", 31 pgs.
"U.S. Appl. No. 15/594,104, Final Office Action dated Oct. 26, 2020", 31 pgs.
"U.S. Appl. No. 15/594,104, Non Final Office Action dated Jun. 24, 2020", 32 pgs.
"U.S. Appl. No. 15/594,104, Non Final Office Action dated Sep. 30, 2019", 26 pgs.
"U.S. Appl. No. 15/594,104, Notice of Allowance dated Jun. 10, 2021", 23 pgs.
"U.S. Appl. No. 15/594,104, Response filed Jan. 26, 2021 to Final Office Action dated Oct. 26, 2020", 13 pgs.
"U.S. Appl. No. 15/594,104, Response filed Feb. 27, 2020 to Final Office Action dated Jan. 2, 2020", 11 pgs.
"U.S. Appl. No. 15/594,104, Response filed Jun. 2, 2020 to Final Office Action dated Jan. 2, 2020", 12 pgs.
"U.S. Appl. No. 15/594,104, Response filed Jun. 26, 2019 to Restriction Requirement dated May 23, 2019", 6 pgs.
"U.S. Appl. No. 15/594,104, Response filed Nov. 19, 2019 to Non-Final Office Action dated Sep. 30, 2019", 15 pgs.
"U.S. Appl. No. 15/594,104, Response Filed Sep. 24, 2020 to Non Final Office Action dated Jun. 24, 2020", 13 pgs.
"U.S. Appl. No. 15/594,104, Restriction Requirement dated May 23, 2019", 7 pgs.
"U.S. Appl. No. 15/594,284, Corrected Notice of Allowability dated Nov. 3, 2021", 9 pgs.
"U.S. Appl. No. 15/594,284, Final Office Action dated May 24, 2021", 12 pgs.
"U.S. Appl. No. 15/594,284, Final Office Action dated Aug. 4, 2020", 11 pgs.
"U.S. Appl. No. 15/594,284, Non Final Office Action dated Jan. 16, 2020", 12 pgs.
"U.S. Appl. No. 15/594,284, Non Final Office Action dated Dec. 31, 2020", 12 pgs.
"U.S. Appl. No. 15/594,284, Notice of Allowance dated Oct. 27, 2021", 13 pgs.
"U.S. Appl. No. 15/594,284, Response filed Mar. 31, 2021 to Non Final Office Action dated Dec. 31, 2020", 7 pgs.
"U.S. Appl. No. 15/594,284, Response filed Apr. 16, 2020 to Non Final Office Action dated Jan. 16, 2020", 9 pgs.
"U.S. Appl. No. 15/594,284, Response filed Sep. 22, 2021 to Final Office Action dated May 24, 2021", 8 pgs.
"U.S. Appl. No. 15/594,284, Response filed Dec. 4, 2020 to Final Office Action dated Aug. 4, 2020", 8 pgs.
"U.S. Appl. No. 16/453,471, Applicant Interview Summary filed Feb. 7, 2022", 1 pg.
"U.S. Appl. No. 16/453,471, Examiner Interview Summary dated Jan. 7, 2022", 2 pgs.
"U.S. Appl. No. 16/453,471, Final Office Action dated Feb. 25, 2021", 39 pgs.
"U.S. Appl. No. 16/453,471, Non Final Office Action dated Sep. 25, 2020", 38 pgs.
"U.S. Appl. No. 16/453,471, Non Final Office Action dated Nov. 2, 2021", 27 pgs.
"U.S. Appl. No. 16/453,471, Notice of Allowance dated Jan. 25, 2022", 23 pgs.
"U.S. Appl. No. 16/453,471, Response filed Aug. 25, 2021 to Final Office Action dated Feb. 25, 2021", 12 pgs.
"U.S. Appl. No. 16/453,471, Response Filed Jan. 25, 2021 to Non Final Office Action dated Sep. 25, 2020", 12 pgs.
"U.S. Appl. No. 16/453,471, Response filed Dec. 2, 2021 to Non Final Office Action dated Nov. 2, 2021", 11 pgs.
Aggour, Kareem, et al., "Mining company networks for marketing insights and sales leads", IEEE/ACM International Conference on Advances in Social Networks Analysis and Mining, (2013), 805-812.
Dubiel, Jorg, "Promoting target models by potential measures", (2010), 13 pgs.
Ramakrishnan, et al., "Automatic sales lead generation from web data", IEEE, Computer society, Proceedings of the 22nd international conference on Data engineering., (2006), 10 pgs.
Yan, Junchi, et al., "Sales pipeline win propensity prediction: A regression approach", arXiv:1502.06229v1, (2015), 5 pgs.

* cited by examiner

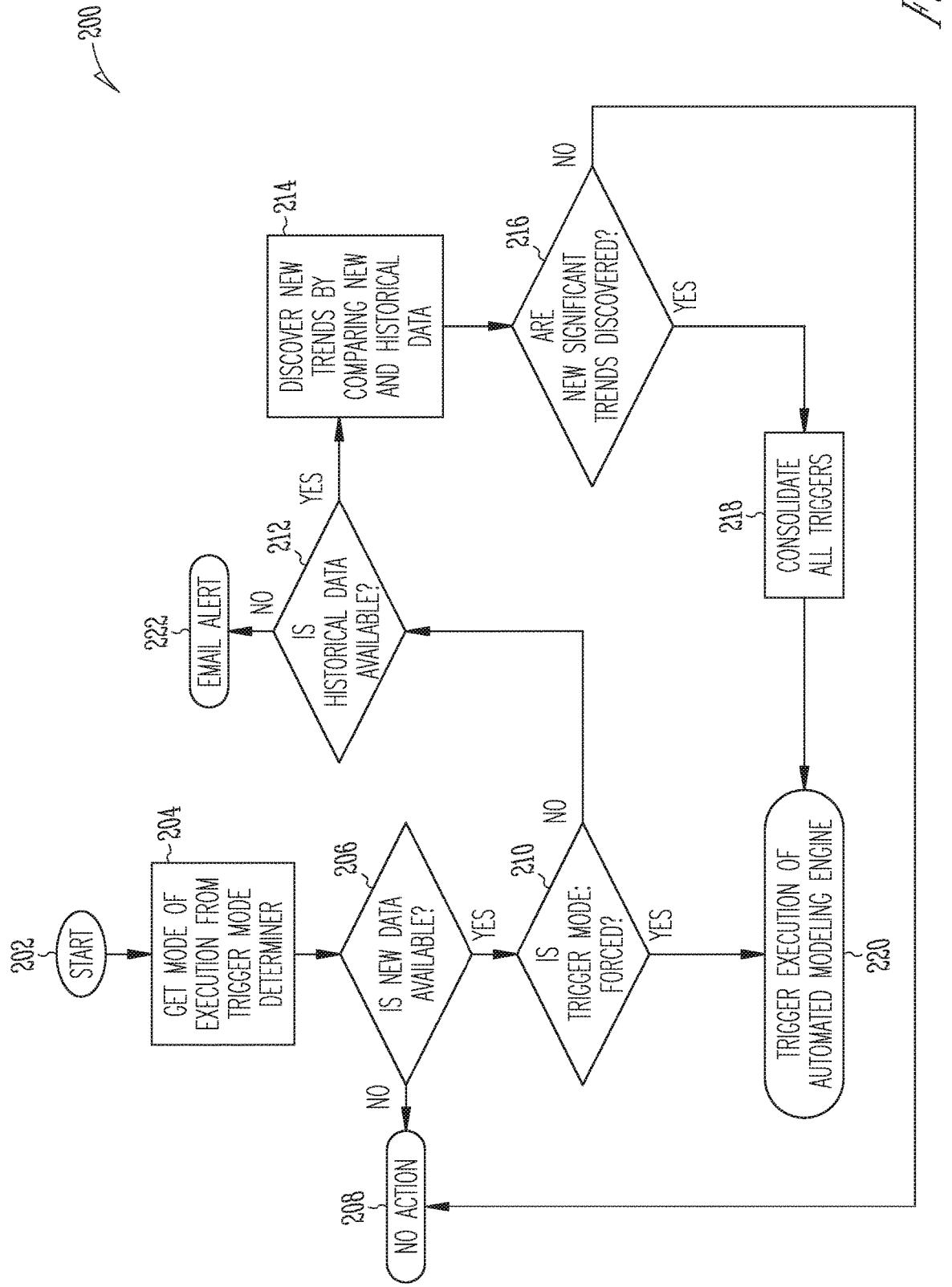

ADAPTIVE REAL TIME MODELING AND SCORING

CLAIM OF PRIORITY

This patent application is a continuation of U.S. application Ser. No. 15/594,284, filed May 12, 2017, which claims the benefit of priority, under 35 U.S.C. Section 119(e), to Korada et al, U.S. Provisional Patent Application Ser. No. 62/336,514, entitled "ADAPTIVE LEAD GENERATION FOR MARKETING", filed on May 13, 2016, which is hereby incorporated by reference herein in its entirety.

TECHNICAL FIELD

Examples described herein generally relate to systems and methods for accurate and efficient adaptive real time modeling and scoring.

BACKGROUND

Conventional computer technology can be used to generate data insights, but these are not always accurate or efficient. Technical problems have not been fully overcome. The present disclosure seeks to address these drawbacks.

BRIEF DESCRIPTION OF THE DRAWINGS

In the drawings, which are not necessarily drawn to scale, like numerals may describe similar components in different views. Like numerals having different letter suffixes may represent different instances of similar components. Some examples are illustrated by way of example, and not limitation, in the figures of the accompanying drawings in which:

FIG. 2 is a flowchart showing one example of a process flow 200 that may be executed, for example, to determine if the execution of an automated modeling engine 120 in the system of FIG. 1 is required.

DETAILED DESCRIPTION

In the following description, for purposes of explanation, numerous specific details are set forth in order to provide a thorough understanding of some examples. It will be evident, however, to one skilled in the art that the present disclosure may be practiced without these specific details.

Various examples are directed to systems and methods for adaptive real-time modeling and scoring. In some applications, these systems and methods may be directed to customer acquisition and customer relationship management to generate web leads or new customer insights across multiple channels (email, display, call center, and so forth). A lead includes data describing a potential customer for a good and/or service. Leads may be used to direct targeted advertising. For example, an advertiser may send advertising communications to a potential customer that are more extensive, personalized, and/or expensive that what the advertiser would send to the general public. A lead may convert if the potential customer described by a lead purchases a product or service from the advertiser or performs an action desired by the advertiser. For example, a lead may be considered to convert if the potential customer fills out a survey or performs another similar action requested by the advertiser.

Figure 1:
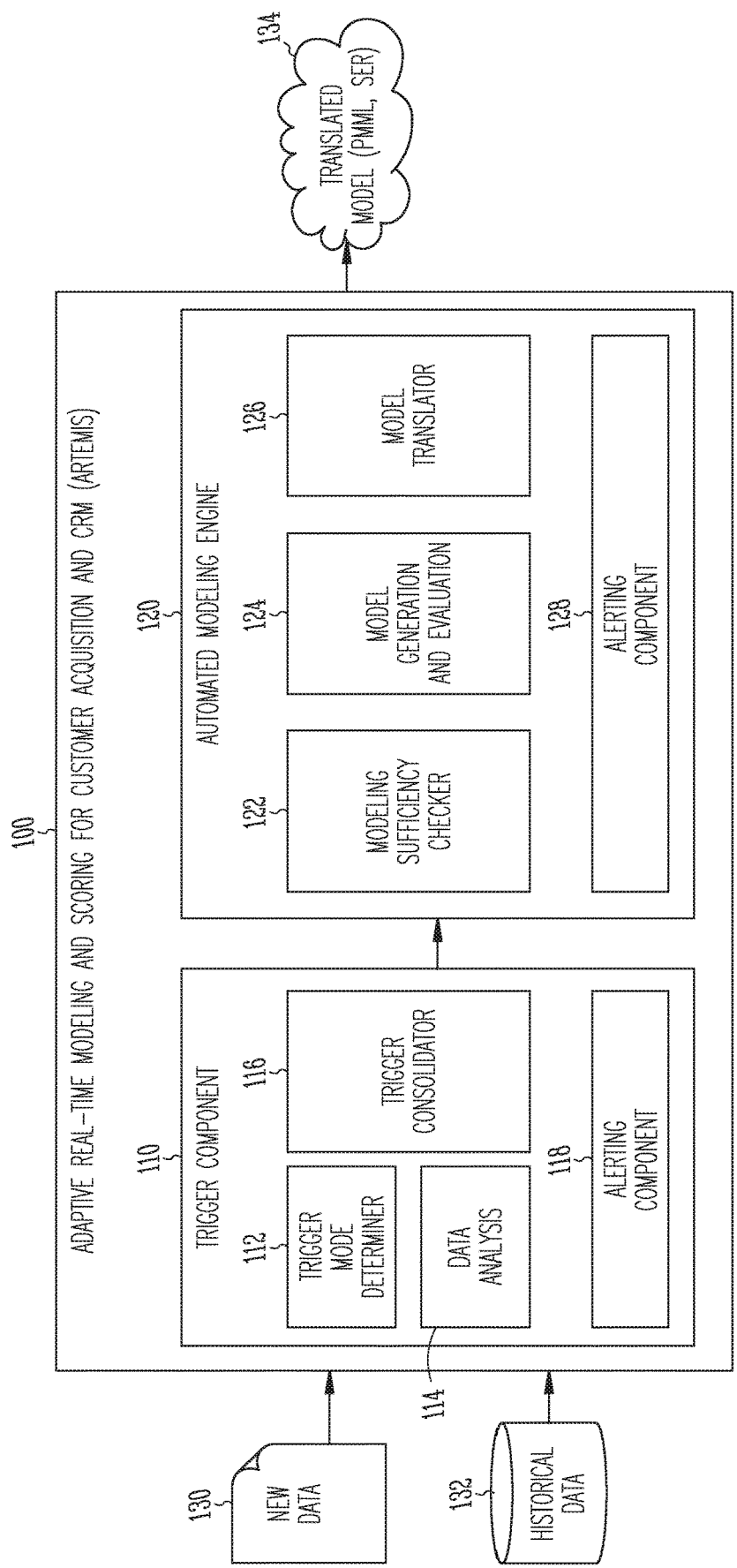
FIG. 1 is a block diagram showing one example of a system for adaptive real-time modeling and scoring.

FIG. 1 shows a system diagram of the adaptive real-time lead-score modeling and scoring system for customer acquisition and customer relationship management (hereinafter ARTEMIS) system 100. The ARTEMIS system 100 includes a trigger component 110. The purpose of the trigger component 110 is to determine if the execution of an automated modeling engine 120 (also known as an adaptive model executor) should be triggered. The trigger component 110 includes a trigger mode determiner 112 which determines a mode of operation i.e., a forced trigger versus an automated trigger as described below. In some embodiments, the trigger component 110 also includes a data analysis component 114, also known in some examples as a new trends discovery component 114, which can compare new data with historical data to discover if there is any significant difference in trends between different variables and determine if the automated modelling engine 120 should be executed. A trigger consolidator module 116 within the trigger component 110 consolidates triggers for all possible combinations of model refreshes from a list of existing models. For example, the output of data analysis component 114 may reveal that a model refresh is required for an advertiser A in a security vertical (as described further below, for example) and an advertiser B in a telecom vertical (for example). An alerting component 118 sends summary alerts as appropriate to users or other entities, for example email alerts to parties such as internal stakeholders as may be defined in certain ARTEMIS system 100 settings.

The trigger component 110 can operate in two modes: forced trigger and automated trigger. In forced trigger mode, a trigger could be the placement of a new advertiser data set on a pre-defined storage location. For example, an advertiser placing a known customer list file on a cloud server configured to interact with the ARTEMIS system 100 will trigger the execution of automated modeling engine component 120. In automated trigger mode, an automated analysis of historical data and new data may reveal significant new relationships between different factors or variables that did not exist previously. Examples of significant new relationships may include the following scenarios. Suppose a scoring model (hereinafter SCa) is currently enabling advertisers to acquire customers. SCa may use observed customer quality for affiliates (among other factors) to estimate lead scores. However, new affiliate X may not have been present in the historical data when SCa was built and deployed. After gathering sufficient data on affiliate X's customer quality, the automated modeling engine 120 can be triggered to update a scoring algorithm. In another scenario, a scoring model (SCa) may currently enable advertisers to acquire customers based on ten different factors, for example. However, SCa may now have access to a new factor asked on an industry web-portal, for example, which can be used to improve the predictive power of the algorithm. This is also a trigger point for an automated refresh or update of a scoring algorithm.

The automated modeling engine 120 includes three sub-components as follows. A modeling sufficiency checker 122 manages critical automated data preparation and transformation stages for the automated refreshing or updating of a scoring algorithm. A model generator and evaluator 124 is designed to generate multiple scoring models and select a preferred or best model based on best-practice heuristics. In one application of the ARTEMIS system 100 in which so-called look-alike modeling is performed (explained below), the model generator and evaluator can develop different audience cluster solutions and select an optimum audience cluster solution based on audience similarity to its own cluster as compared to other clusters. This measure is known as the Silhouette coefficient. Other heuristics can also be used to evaluate the models and choose an optimum version as the final model. Once a final model is determined, a model translator 126 can converts a statistical or machine-learning model format and place it on a cloud server 134 (for example) to be consumed by an engineering system capable of understanding the translated model. For example, a SCoring-as-a-Service (SCaaS) server which uses models coded in Predictive Modeling Markup Language (PMML) standard, such as a server and associated methods and systems described in published patent application US 2016/0328658. Model translation to other formats like Serialized objects is also possible.

FIG. 2 shows a flowchart showing one example process flow 200 of the trigger component 110 in FIG. 1. The process flow may begin at action 202. A mode of execution is determined at action 204 by the trigger mode determiner 112 shown in FIG. 1. At action 206, the process 200 includes a check whether new data is available which should trigger execution of the automated modeling engine 120 in FIG. 1. If new data is not available, there is no further action taken and the process 200 terminates at action 208.

At action 210, a check is made to determine if the trigger mode is forced i.e., whether a new data file is found at a pre-defined server location, for example. If yes, at action 220, the automated modeling engine 120 is triggered into execution. If the trigger mode is not forced, at action 212, a check is made to determine availability of historical data. If historical data is not available, an email alert is issued and the process terminates at action 222. If the historical data is available, historical data and new data are compared at action 214 to discover any new significant trends that justify an automated real-time modeling update. If no new trends are discovered, the process terminates at action 208. If new significant trends are discovered, triggers are consolidated for all combinations of existing models at action 218. Once all triggers are consolidated, triggers are issued for the execution of the automated modeling engine 120 at action 220.

Figure 3A:
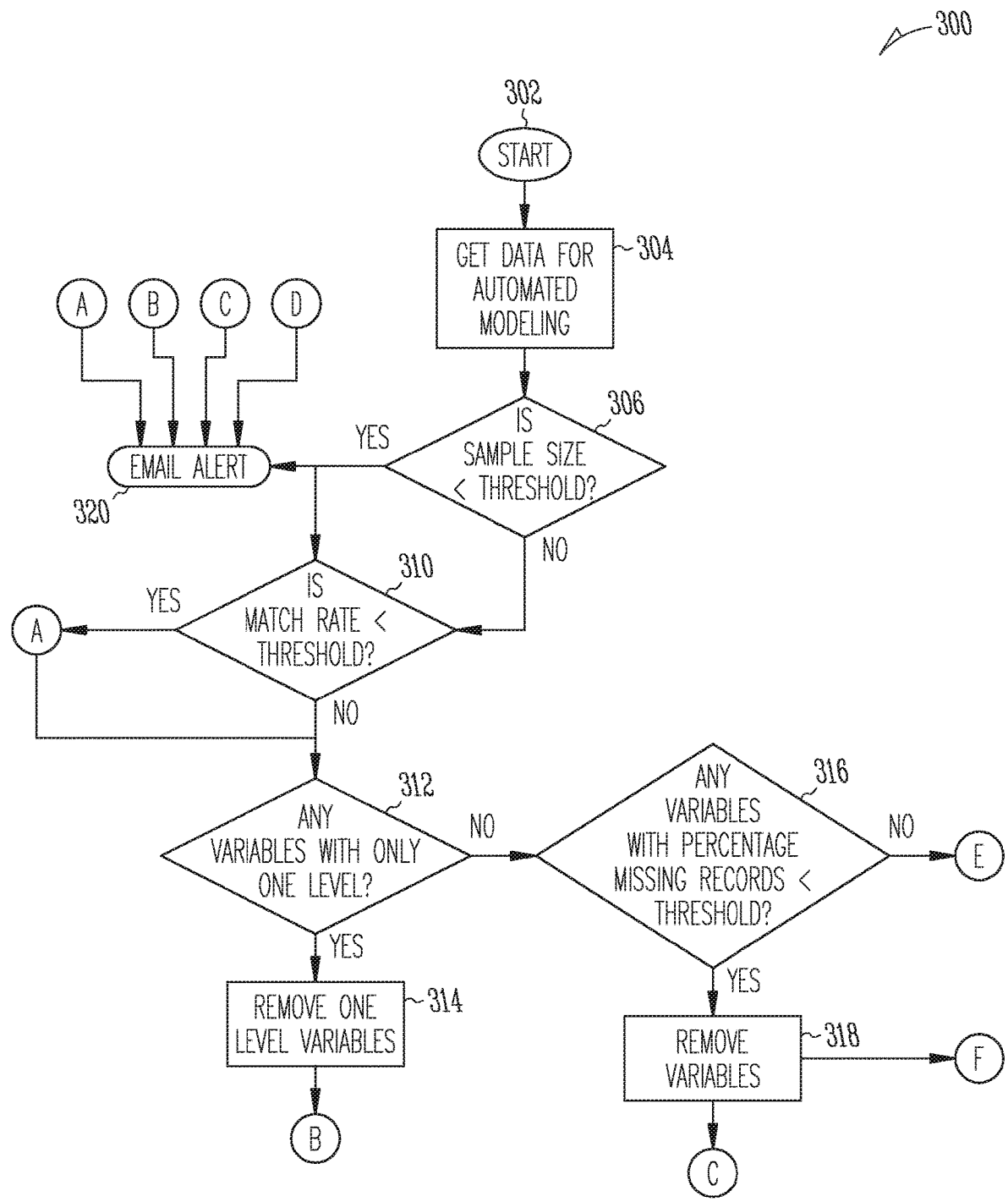
FIGS. 3A-3B illustrate one example of a process flow 300 which enables the automated modeling engine 120 of FIG. 1 to generate a scoring model in an engineering system-consumable format like PMML, for example.
Figure 3B:
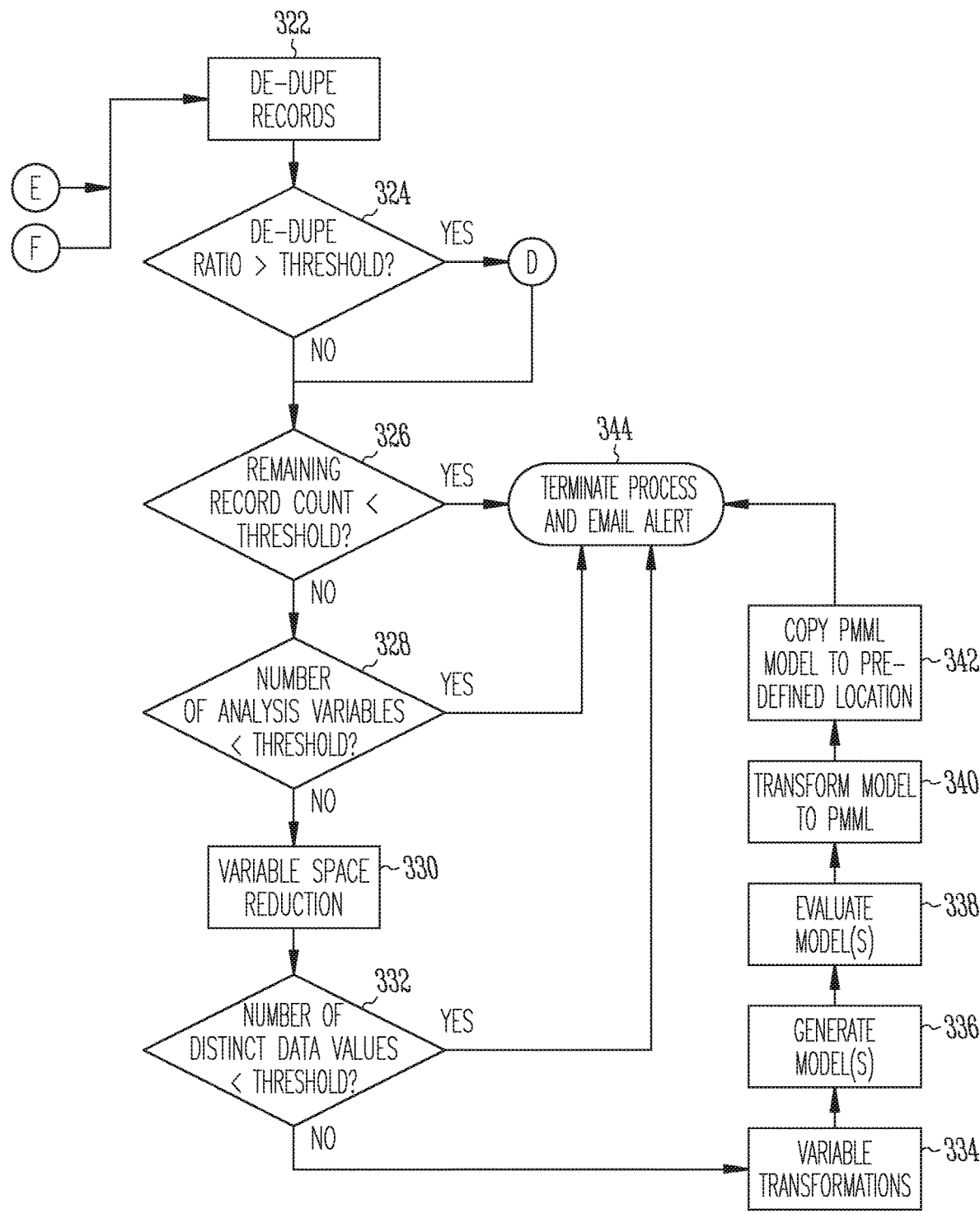

FIGS. 3A-3B show a flowchart of an example process flow 300 of the automated modeling engine 120. The process 300 may begin at action 302. At action 304, the new data is retrieved from a pre-defined server location for execution. At action 306, a check is made to determine if a sample size of available data is less than a pre-defined threshold. If yes, at action 320 an email alert is issued to relevant stakeholders and the process 300 continues to action 310. If the sample size is greater than the threshold amount, at action 310 a check is made to determine if a match rate between first-party and third-party data is less than a threshold amount. If the match-rate is less than the threshold, an email alert is issued at 320 and the process 300 continues to action 312. If the match-rate is greater than the pre-defined threshold, at action 312 a check is made for any variables with only one level. If such variables are found, these variables are removed from the data at action 314 and an email alert is issued at action 320. The process 300 continues to action 316. At action 316, a check is made to identify any variable with a percentage of missing values greater than a pre-defined threshold. If such variables are found, these variables are removed at action 318 and an email alert is issued at action 320. The process 300 continues to action 322. If no variables have a percentage of missing records greater than the threshold, at action 322 records are de-duped to remove redundant information.

At action 324, if the de-dupe ratio (or percentage) is greater than a pre-defined threshold an email alert is issued to relevant stakeholders at action 320 and the process 300 continues to action 326. At action 326, if after de-duping records, the remaining number of model-ready records are less than a pre-defined threshold then the process 300 is terminated at action 344 along with an email alert. If post de-dupe a record count is greater than the pre-defined threshold, a check for remaining number of analysis variables occurs at action 328. If this number is less than a pre-defined threshold then the process terminates at action 344 along with an email alert. If the number of analysis variables is greater than threshold, the number of variables are reduced using a combination of correlation analysis, principal components and chi-square tests at action 330. A final Singularity check at action 332 ensures that the model(s) generated in action 336 will converge to a specific solution.

After all modeling sufficiency checks are done, variables are transformed based on their measurement type at action 334. One or more models are generated at action 336. Model(s) is/are evaluated at action 338 using a heuristic measure based on the type of modeling technique. Action 338 yields the most optimal scoring model. This is converted to a PMML file at action 340. At action 342, the model PMML is stored on a pre-defined server location for downstream application to generate leads, select records for extending audience or generating insights by applying to call-center marketing systems. The process finally terminates at action 344 after a successful end-to-end run.

Figure 4:
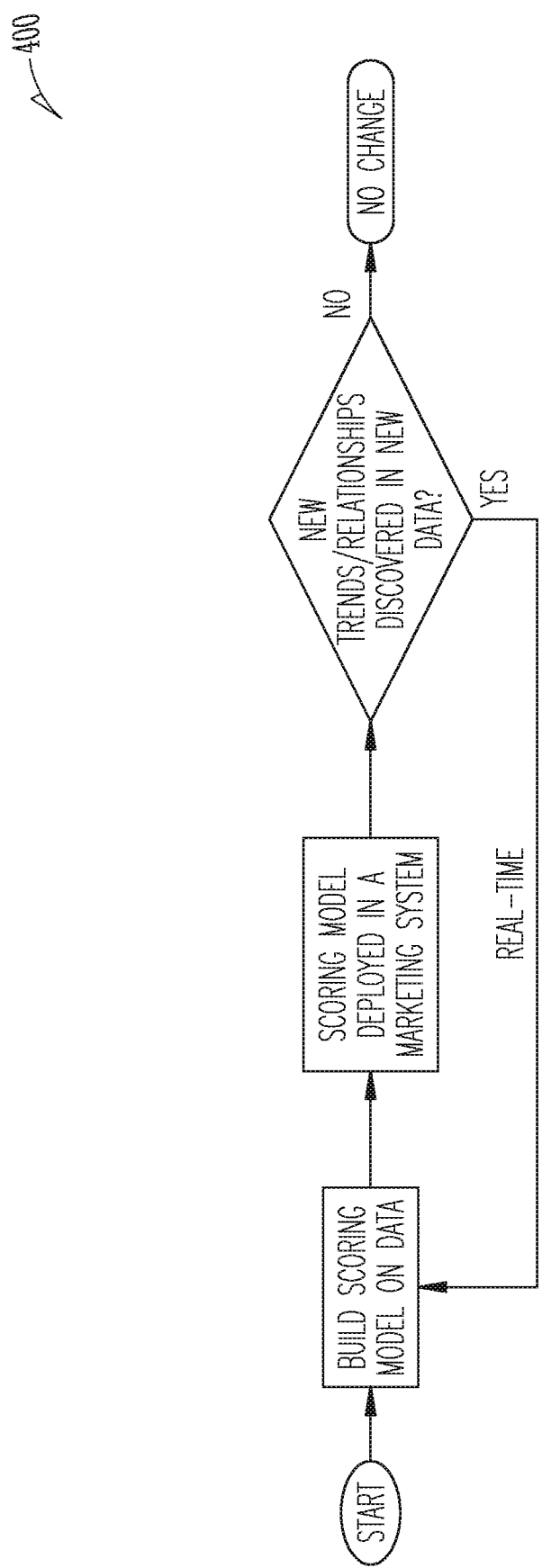
FIG. 4 is a flowchart showing a process flow for a self-learning model, according to an example embodiment.
Figure 5:
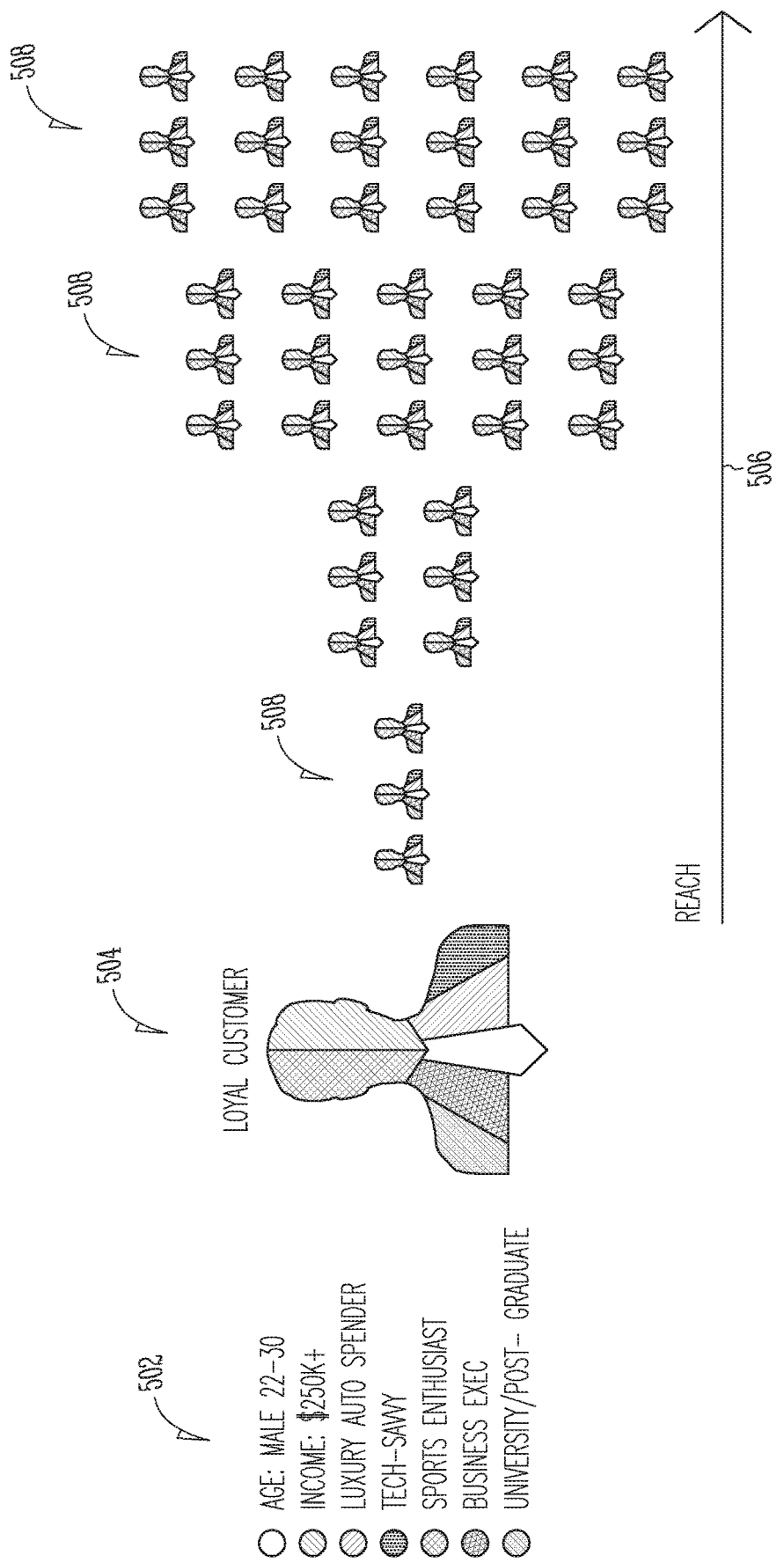
FIG. 5 is a diagram showing aspects of the creation of a look-alike audience in an adaptive real time modeling and scoring system and method, in accordance with some example embodiments.

In one example of adaptive real time modeling and scoring, look-alike modeling is performed. Reference is now made to FIG. 5 in this regard. The ARTEMIS system 100 in FIG. 1 can automatically refresh, update or regenerate a predictive scoring model algorithm based on continuously changing input traffic at input portal, such as display traffic 902 or email traffic 904 in FIG. 9 for example. In one example, a regenerated model can include or be based on a look-alike audience. The ARTEMIS system 100 thus provides a technical, dynamic or adaptive, solution which addresses the inaccurate and inefficient lead generation of conventional technology discussed further above. The creation of look-alike audiences can enable marketers to define attributes and behaviors of their most valuable customers and then use these profiles to target matching prospects. Since the new audience segments will be similar to current customers, advertisers can expect to see a higher likelihood of conversion. The look-alike technique employs, in some examples, self-learning algorithms which are applied to rich audience data sets to produce a range of highly relevant look-alike segments. An example flow for a self-learning algorithm is shown in FIG. 4.

When a scoring model is built on training data, intelligence on trends and relationships between different variables is embedded in the scoring model. This model can then be deployed on a marketing system. A few example applications may include scoring lead traffic or selecting records for an email marketing campaign or anticipating customer challenges for in-bound calls in a call center. An important component to a self-learning model is the automated discovery of new trends and data relationships in the data available on the marketing system. If new trends and relationships can be discovered, a self-learning model will adapt or update itself by codifying the newly discovered relationships. This process is iterative.

Thus, again with reference to FIG. 5, a profile 502 of an existing customer 504 may include aspects such as age (e.g. male 22-30), income (e.g. $250K+), spending habits (e.g. luxury auto spender), hobbies (e.g. tech savvy), interests (e.g. sports enthusiast), employment (e.g. business executive) and qualifications (e.g. university/post-graduate). A range (or extended reach) 506 of look-alike segments 508 can be selected as described below.

Figure 6:
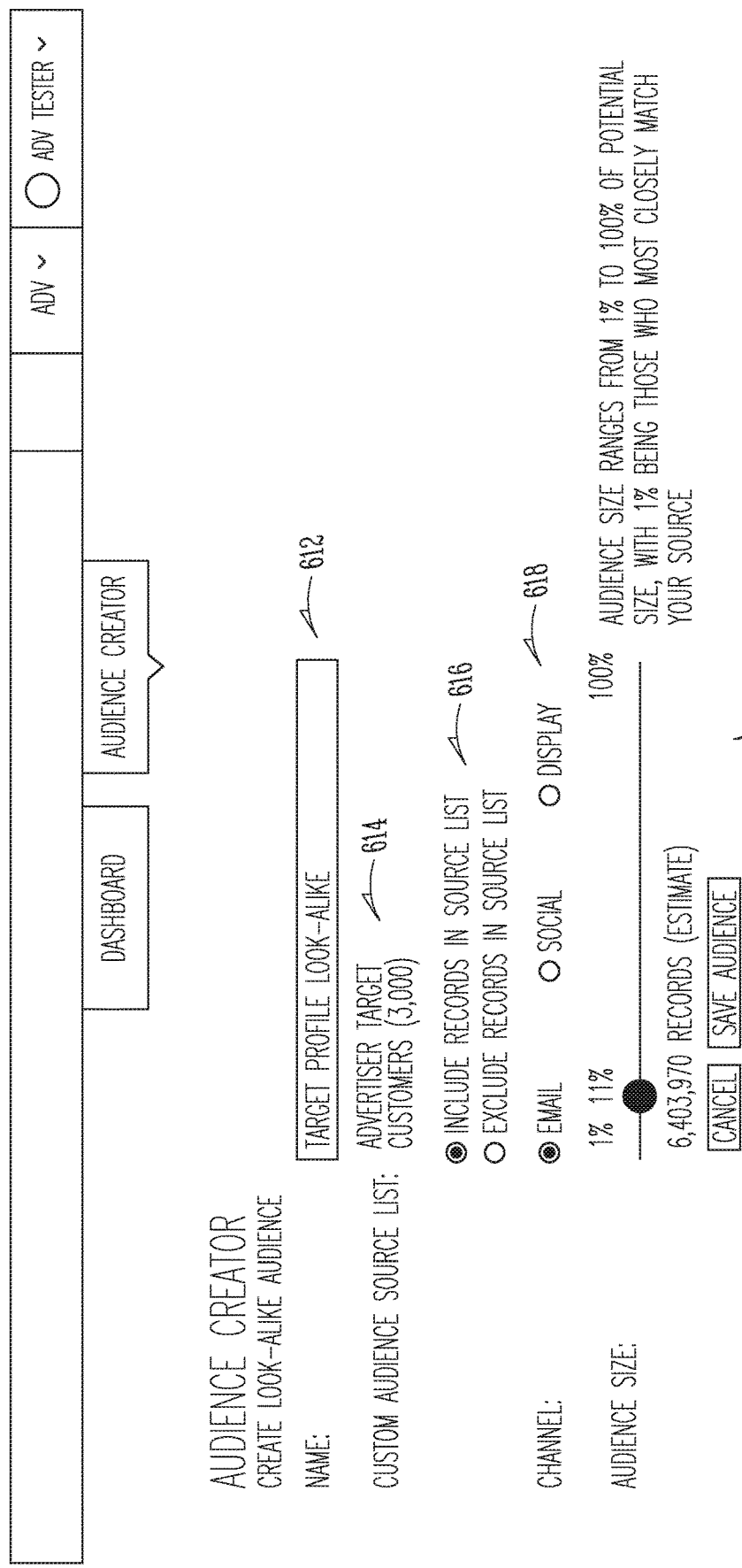
FIG. 6 is a diagram showing aspects of a user interface for a look-alike audience creator in an adaptive real time modeling and scoring system and method, in accordance with some example embodiments.

In this regard, an audience creator is provided. In one example, the audience creator includes an interactive user interface 610 as shown in FIG. 6 which may form part of, or drive decisions made by, the ARTEMIS system 100 of FIG. 1. The user interface 610 includes at data entry field 612 into which the name of a desired look-alike audience can be entered. At user element 614, audience source lists can be customized and selected. These sources might include, for example, the display traffic source 902 or email traffic source 904 of FIG. 9. At user element 616, a selection can be made of whether to include (or exclude) from the look-alike audience, records in the source list(s). At user element 618, one or more input channels can be selected, for example email, social, or display channels. An audience size can be modified and selected using a sliding user element 620. Based on a user's movement of the slider element 620, an audience size can be selected to range from 1% to 100% of a potential size and degree of similarity, with 1% representing a highly-condensed smaller look-alike audience that most closely matches targets in the selected sources 612.

The audience creator enables a user to conveniently build and execute a look-alike audience for campaigns across multiple channels and at scale. A user can with great facility define one or more source audiences by sending or uploading customer profiles or traffic into the audience creator. Based on identifying common attributes and patterns, a look-alike algorithm continuously refines and updates the look-alike audience in response to changes and/or growth in the input sources.

Figure 7:
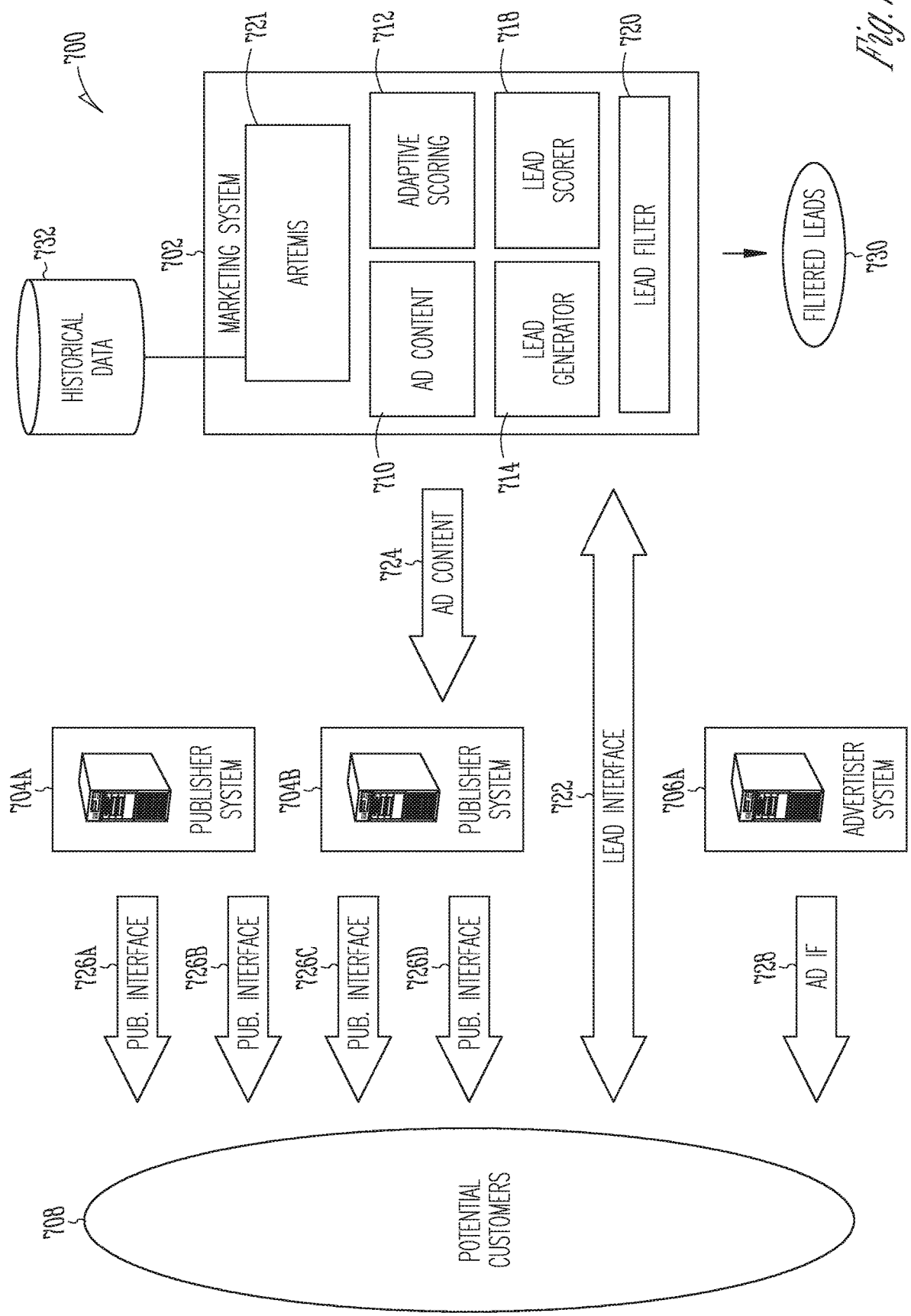
FIG. 7 is a diagram showing one example of an environment for the application of adaptive real time modeling and scoring system.

In another example, the ARTEMIS system 100 in FIG. 1 acts as a sub-system of a customer acquisition computerized marketing system 702 (also termed CACM system, or simply marketing system 702 herein) shown in FIG. 7. The CACM system 702 is programmed to acquire new customers for advertisers by generating and filter leads through web portals, and may generate leads from various different sources. For example, the CACM system, or other suitable system, may provide advertising content to one or more publishers. Publishers distribute content to the public, for example, via the Internet. A publisher incorporates ad content into the content that it provides to the public. The advertising content may include a hyperlink or other link that is selectable by a potential customer to access a lead generator interface provided by the marketing system.

Through the lead generator interface, the marketing system may prompt the potential customer to provide information about him or herself, referred to as lead information. Lead information may include information such as the potential customer's name, age, geographic location, etc. In some examples, lead information also includes information relevant to the advertised goods and/or service. For example, if the advertiser is an educational institution, the lead generation interface may prompt the potential customer to provide data such as, age, highest level of education achieved, how soon the potential customer intends to begin schooling, etc. In another example, if the advertiser sells home security systems, the lead generation interface may prompt the potential customer to provide data such as, whether the potential customer owns or rents a house, whether the potential customer has experienced a break-in, etc. The marketing system may receive information from the potential customer and format the information into a lead.

The marketing system is also programmed to filter leads. For example, some leads are more likely to convert than others. The marketing system may train a model to correlate lead information to the likelihood that a lead will convert. Any suitable model may be used. The marketing system may utilize the model to provide a lead score to the leads, where the lead score for a lead is a value indicating a probability that the lead will convert (e.g., the likelihood that the potential customer described by a lead will purchase a good and/or service from the advertiser). The marketing system may generate filtered leads based on the assigned lead score. In some examples, filtered leads include only leads having a lead score indicating a probability that the leads will convert is greater than a lead score threshold value.

In one example, the ARTEMIS system 100 (shown as sub-system 721 in FIG. 7) is programmed to adapt the lead scoring model/or algorithm to changes in the quality profile of recent lead inventory. Lead quality profile may change for various reasons. In some examples, a new publisher whose quality profile is significantly different from existing publishers, may have been recently added to the marketing system to drive web traffic to generate leads. In another example, a single publisher may publish the same ad content through multiple web pages or other sources. For example, a publisher may produce a serious news web page along with a less serious or tabloid-type news web page. Leads from readers of one web page over the other may be more likely to convert. Over time, the mix of leads provided by the publisher may change, causing a change to the quality of leads from the publisher.

The ARTEMIS system 721 in FIG. 7 (in this example) is programmed to monitor real-time lead data and compare it with the historical lead database. The historical lead database contains all pertinent lead information of leads delivered to advertiser in the past along with quality metrics indicating how the lead performed for the advertiser. If there is a new publisher that has started to drive significant lead volume in the very recent past, the ARTEMIS system may adapt the lead scoring model to include quality classification of this new publisher. Also, if the long-term historical quality of a publisher is significantly different from the short-term historical quality of a publisher, ARTEMIS system may adapt the lead scoring model. Adapting the lead scoring model may include changing one or more scoring model parameters affecting the way that lead scores are generated. For example, a lead scoring model generates an equation of predictive factors weighted by their importance in predicting the likelihood of a lead to convert used to assign lead scores to leads. Adapting the scoring model may include changing one or more predictive variable weights affecting the way that the scored leads are filtered. In this way, the marketing system may adapt to changes in lead score quality. When a scoring and/or filtering parameter is modified, subsequent leads may be scored and/or filtered with the new scoring and/or filtering parameters.

In other aspects, FIG. 7 shows one example of an environment 700 for adaptive lead generation. The environment includes the marketing system 702, publisher systems 704A, 704B, an advertiser system 706A and potential customers 708. The marketing system 702 may comprise one or more servers or other computing devices programmed to adaptively generate leads, as described herein. The marketing system 702 may comprise components 710, 712, 718, 720. Components 710, 712, 718, 720 may be implemented by the marketing system 702 in any suitable combination of hardware or software. Similarly, the publisher systems 704A, 704B and advertiser system 706A may comprise one or more servers or other computing devices programmed to execute as described herein. Potential customers 708 may include people who interact with one or more of the systems 702, 704A, 704B, 706A, as described herein. Potential customers 708 may interact with one or more of the systems 702, 704A, 704B, 706A utilizing any suitable computing device, for example, as described in FIG. 2.

The marketing system 702 may, optionally, include an ad content component 710. The ad content component 710 may comprise one or more programmed servers or other computing devices. In some examples, the ad content component 710 may be executed on a common computing device with one or more of the other components 712, 714, 718, 720 of the marketing system 702. The ad content component 710 provides ad content 724 to one or more of the publisher systems 704A, 704B. Although two publisher systems 704A, 704B are shown, the ad content component 710 may provide ad content 724 to any suitable number of publisher systems. The ad content 724 may include information describing goods and/or services provided by an advertiser or other entity. Also, in some examples, the ad content 724 may include a Universal Resource Locator (URL) or other suitable address for the lead interface 722, described in more detail below.

Publisher systems 704A, 704B provide publisher interfaces 726A, 726B, 726C, 726D to the potential customers 708. Publisher interfaces 726A, 726B, 726C, 726D may include content provided by the publisher systems 726A, 726B (publisher content) and ad content that is or is derived from ad content 724. Publisher content and ad content included in the publisher interfaces 726A, 726B, 726C, 726D may include, for example, text, images, audio files, video files, etc. Publisher interfaces 726A, 726B, 726C, 726D may include any suitable interface or interfaces for providing publisher content to the potential customers 708. For example, one or more of the publisher interfaces 726A, 726B, 726C, 726D may include a website served to the potential customers. In some examples, one or more of the publisher interfaces 726A, 726B, 726C, 726D may include an e-mail sent to the potential customers. Although four publisher interfaces 726A, 726B, 726C, 726D are shown in FIG. 7, any suitable number of publisher interfaces may be included in the environment 700. In some examples, a single publisher system 704A may serve more than one publisher interface 726A, 726B, 726C, 726D.

The potential customers 708 may receive one or more of the publisher interfaces 726A, 726B, 726C, 726D. As described above, publisher interfaces 726A, 726B, 726C, 726D may include a link to the lead interface 722. A potential customer 708 with interest in the goods and/or services described by the ad content in a publisher interface 726A, 726B, 726C, 726D may select the link in the interface 726A, 726B, 726C, 726D. The link may point to the lead interface 722, which may be served by a lead generator component 714 of the marketing system 702.

The lead generator component 714 may comprise one or more programmed servers or other computing devices. In some examples, the lead generator component 714 may be executed on a common computing device with one or more of the other components 710, 712, 718, 720 of the marketing system 702. The lead generator component 714 may generate and serve the lead interface 722 to one or more of the potential customers 708 (e.g., one or more of the potential customers 708 who select the described link in a publisher interface 726A, 726B, 726C, 726D). The lead interface 722 may prompt a potential customer to provide lead information about the potential customer. The lead information may include information about the potential customer including, for example, the potential customer's name, age, e-mail address, mailing address, phone number, etc. Lead information may also include information specific to the product and/or service indicated by the ad content. For example, where the product is home-delivered food service, the lead interface 722 may prompt the potential customer to provide the number of people in their household, the number of meals that their household eats at home in a week, etc. In another example where the product is a dry cleaning service, the lead interface 722 may prompt the potential customer to provide the number of dry cleaned items that the potential customer's household wears in a week, etc. The lead generator component 714 may be programmed to receive and process lead data received from the potential customers 708 via the lead interface 722 into leads. As described above, a lead may include lead information describing a potential customer. The lead generator component 714 may process lead data into leads in any suitable format.

In some examples, the lead generator component 714 also categorizes leads. Any suitable categories may be used. For example, leads may be categorized by vertical, by advertiser, by product, by publisher, etc. A vertical or business area category for a lead may describe a category of goods and/or services that the potential customer may be interested in purchasing. Example verticals include education (for potential customers with interest in attending an educational institution), home security (for potential customers interested in purchasing a home security system and/or service), insurance (for potential customers interested in purchasing car, home, or other insurance), etc. An advertiser category for a lead may describe the advertiser whose products are of interest to the potential customer. For example, an advertiser may be a particular educational institution, a particular home security system, etc. A product category for a lead may describe a particular product (or service) of interest to the potential customer. An example product within a home security vertical for a particular advertiser may be a particular model of security system or a particular type of monitoring services. A publisher category for a lead may describe the publisher from which the lead was generated. For example, if the potential customer described by a lead accessed the lead interface 722 via a link from the publisher system 704A, the publisher category of the resulting lead may describe the publisher implementing the publisher system 704A. In some examples, a category or categories for a lead may be embedded into the lead itself. For example, data describing the potential customer may be supplemented with data describing one or more categories of the lead.

A lead scorer component 718 may apply a predictive model to leads generated by the lead generator component 714 and assign to each considered lead a lead score. The lead scorer component 718 may comprise one or more programmed servers or other computing devices. In some examples, the lead scorer component 718 may be executed on a common computing device with one or more of the other components 710, 712, 714, 720 of the marketing system 702. Any suitable predictive model may be used including, for example, a decision tree or random forest correlation model, a linear regression model, a non-linear regression model, an evolutionary model, a neural network model, a Bayesian model, etc. The lead scorer component 718 may apply the predictive model to a lead to generate a lead score. The lead score is a value indicating a probability that the lead will convert (e.g., the probability that the potential customer described by the lead will purchase a good or service from the advertiser). The lead score may be expressed on any suitable scale such as, for example, from 0 to 1, from 0 to 100, etc. The lead scorer component 718, in some examples, may execute in a cyclic manner. For example, the lead scorer component 718 may operate once a day, twice a day, once an hour, etc. During each operation, the lead scorer component 718 may act on leads received since the execution of its previous cycle. These may be referred to as cycle leads or execution cycle data. Execution cycle data may be received by the lead scorer component 718 continuously, intermittently, or in batches.

In some examples, the lead scorer component 718 also trains the predictive model. For example, the lead scorer component 718 may receive conversion data for a training set of leads, for example, from an advertiser. The training set of leads may be previously-generated leads that were provided to the advertiser. The advertiser, or other suitable party, may generate conversion data for the training set of leads by tallying whether the training leads were successfully converted (e.g., whether the potential customer described by the lead purchased a good or service from the advertiser). Accordingly, the lead scorer component 718 may select predictive scoring parameters based on the training set and the conversion data. Predictive scoring parameters may include, for example, coefficients of one or more equations of the predictive model, A lead filter component 720 may filter leads generated by the lead generator component 714 and scored by the lead scorer component 718. The lead filter component 720 may comprise one or more programmed servers or other computing devices. In some examples, the lead filter component 720 may be executed on a common computing device with one or more of the other components 710, 712, 714, 718 of the marketing system 702. In some examples, the lead filter component 720 may apply a lead score threshold. Leads with a lead score exceeding the lead score threshold may be included in a set of filtered leads 730. Leads with a lead score less than or equal to the lead score threshold may not be included in the filtered leads 730. Because a lead score describes the likelihood that a potential customer will convert (e.g., purchase the advertised product and/or service), the filtered leads 730 may describe potential customers that are most likely to convert. Filtered leads 730 may be provided to an advertiser or other party that, for example, may use the filtered leads 730 to direct additional marketing. The lead filter component 720 may apply filter parameters such as, for example, the lead score threshold. The filtering parameters may be changeable, as described herein. When the lead filter component 720, for example, receives a new lead score threshold for leads (or for leads in certain categories or combinations of categories), subsequent leads (or subsequent leads in the indicated categories) may be filtered according to the new lead score threshold.

In some examples, the environment 700 also includes one or more advertiser systems 706A. Advertiser systems, such as the example advertiser system 706A, may be implemented by an advertiser (e.g., a business entity that is selling goods and/or services or a representative of the business entity that is selling goods and/or services). The advertiser system 706A may provide to the potential customers an advertiser interface 728 that provides content related to the goods and/or services for sale. For example, when the advertiser is an educational institution, the advertiser interface 728 may be a website for the advertiser. The advertiser interface 728 may comprise a link to the lead interface 722 that may allow potential customers 708 who receive the advertiser interface 728 to select the link and proceed to the lead interface 722 as described herein.

FIG. 2 is a diagram showing another example of the environment 700 of FIG. 7 with additional components. FIG. 2 shows the marketing system 702, publisher systems 704A, 704B, and advertiser system 706A described above. FIG. 2 also shows an additional advertiser system 706B. For example, the marketing system 702 may be programmed to execute adaptive lead generation for more multiple advertisers at the same time. It will be appreciated that any suitable number of the systems 704A, 704B, 706A, 706B, 702, etc. may be included in the environment 700.

Figure 8:
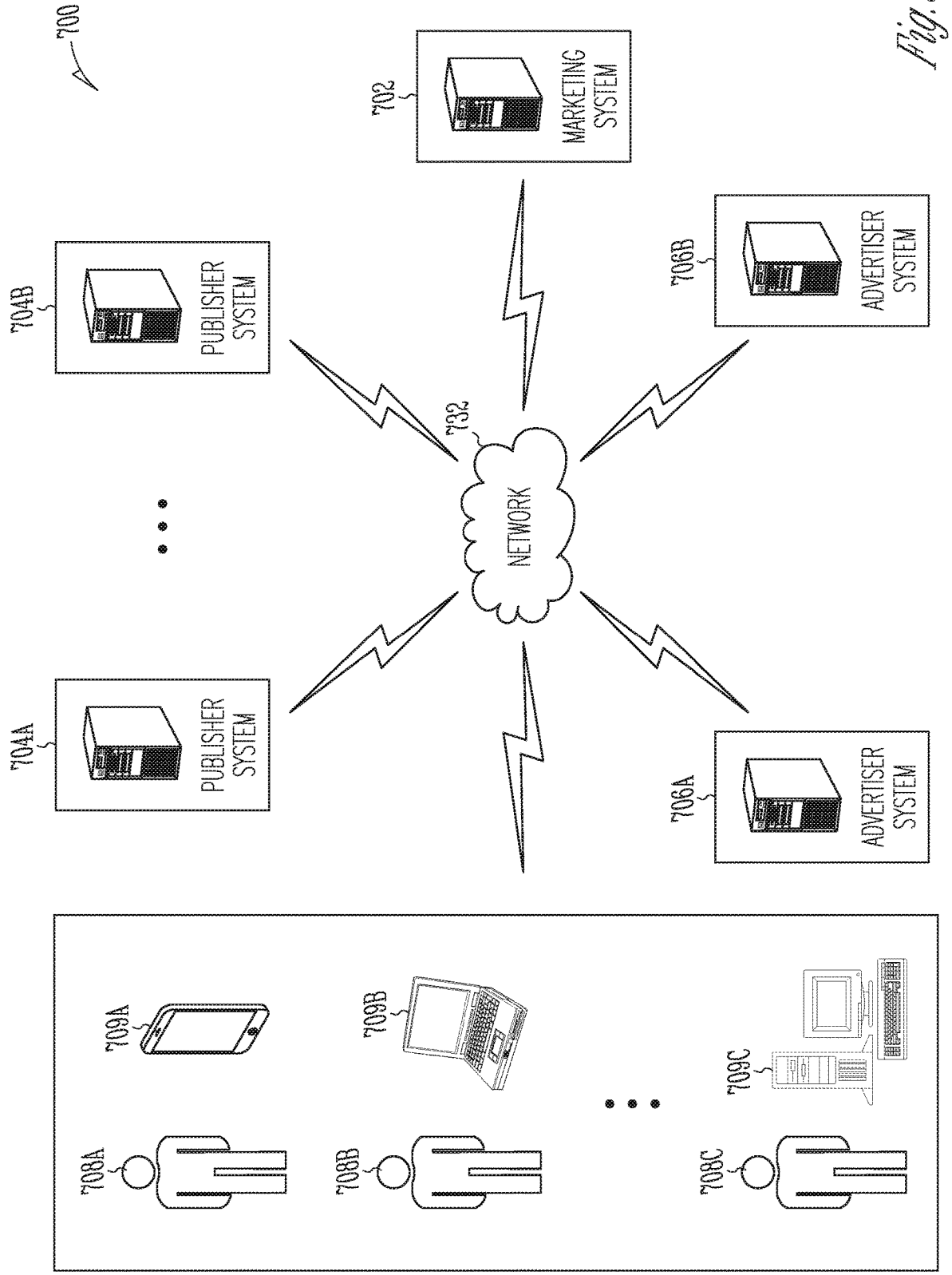
FIG. 8 is a diagram showing another example of the environment of FIG. 7 with additional components.

FIG. 8 also shows potential customers 708A, 708B, 708C utilizing customer computing devices 709A, 709B, and 709C. Although three customers 708A, 708B, 708C and three customer computing devices 709A, 709B, 709C are shown in FIG. 2, any suitable number of potential customers 708A, 708B, 708C may receive publisher interfaces 726A, 726B, 726C, 726D and/or advertiser interface 728. Similarly, any suitable number of potential customers 708A, 708B, and 708C may interact with the lead interface 722.

Potential customers 708A, 708B, 708C may receive and interact with publisher interfaces 726A, 726B, 726C, 726D, advertiser interface 728, and/or lead interface 722 utilizing customer computing devices 709A, 709B, 709C. Customer computing devices 709A, 709B, and 709C may include any computing device suitable for receiving and/or interacting with a user interface. For example, customer computing device 709A may be a tablet computing device and/or mobile phone. Customer computing device 709B may be a laptop computer. Customer computing device 709C may be a desktop computer. Customer computing devices 709A, 709B, 709C, however, may include any other suitable computing device.

The various components of the environment 700 may be in communication with one another via a network 732. The network 732 may be or comprise any suitable network element operated according to any suitable network protocol. For example, one or more portions of network 732 may be an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, a wireless network, a Wi-Fi network, a WiMAX network, another type of network, or a combination of two or more such networks.

Figure 9:
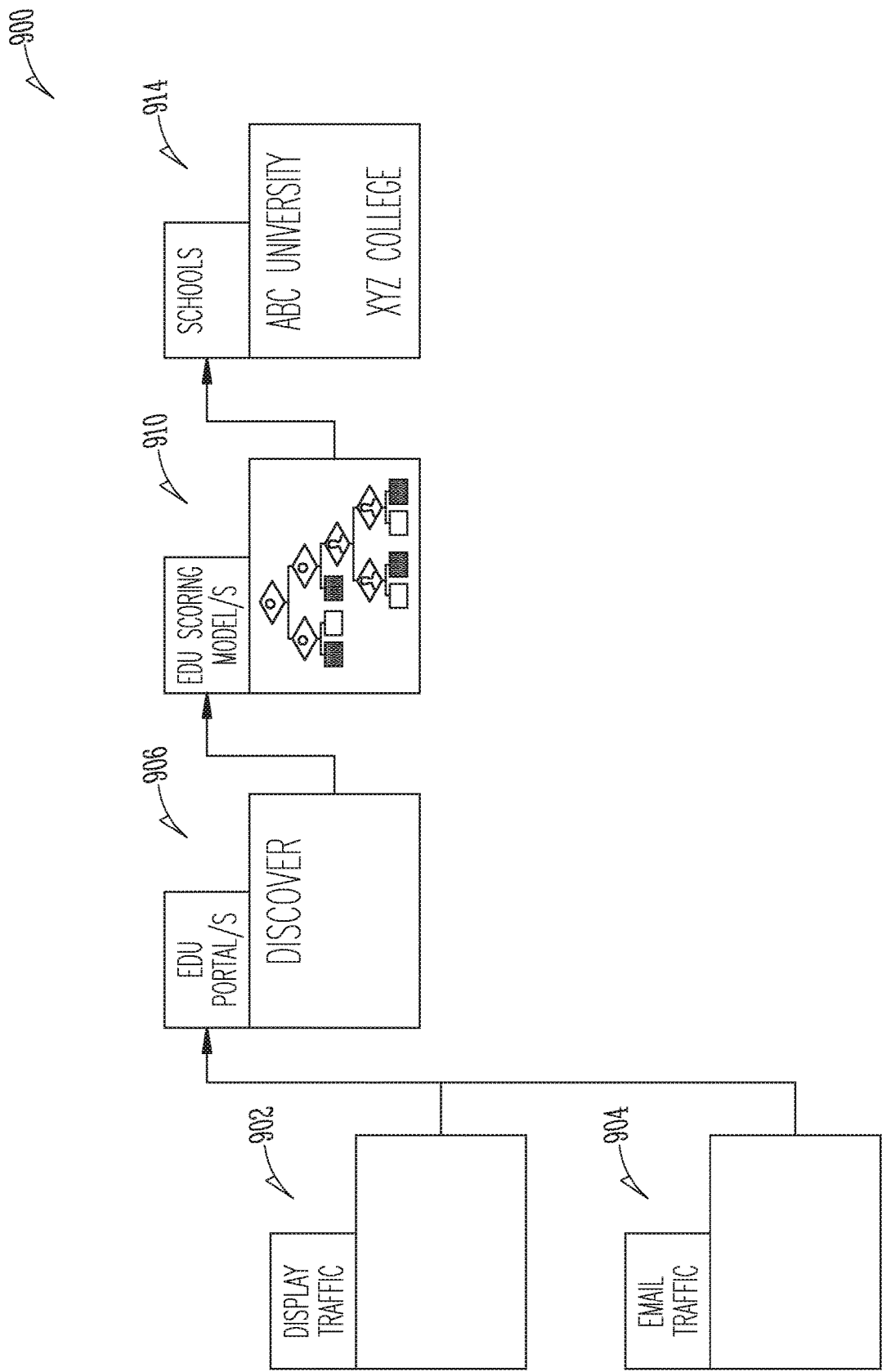
FIG. 9 is a flowchart showing another example of a process flow 900 that may be executed by the component 100 of FIG. 1 to provide adaptive real time modeling and scoring, in accordance with some example embodiments.

As mentioned above, one example of the ARTEMIS system 100 of FIG. 1 may automatically regenerate a predictive model in whole or in part utilized by the lead scorer component 718 based, for example on new and ever-changing input, such as real time changes in display traffic 902, or email traffic 904, shown in the flow chart of FIG. 9. With reference now to FIG. 9, display traffic 902 and email traffic 904 associated with respective portal(s) 906 may be used as input into respective adaptive real time modeling and scoring models 910 (discussed herein) to generate accurate and efficient data insights and leads for schools 914, for example. Other use cases are possible.

Thus, there is provided in some examples, an adaptive real time modeling and scoring system for generating scoring models, the system comprising, at least: a trigger component to determine, based on a threshold or trigger, for example a trigger such as a detection of new significant relationships in historic or recent data, whether a predictive scoring model is ready for a refresh or regeneration; an automated modeling sufficiency checker to receive and transform user-selectable system input data, the user-selectable system input data comprising at least one of email, display or social media traffic; an adaptive modeling engine operably connected to the trigger component and modeling sufficiency checker, and configured to: monitor and identify a change in the input data and, based on an identified change in the input data, automatically refresh or regenerate the scoring model for calculating new lead scores; and output a refreshed or regenerated predictive scoring model.

The automated modeling engine may be further configured to receive an input defining a user profile of an existing target user and, based on the received user profile, generate a look-alike audience comprising potential target users replicating at least in part aspects of the user profile.

The system may further comprise a look-alike audience creator, the look-alike audience creator including an interactive user interface for receiving user selections relating to at least some aspects of the user profile. The interactive user interface may include a user element for receiving a selection of a degree of replication accuracy or population size of the look-alike audience generated by the automated modeling engine. The received user profile may be based at least in part on the user-selectable input data.

In some example applications, the refreshed or regenerated model output by the system is used to personalize conversation for in-bound calls at a call center, or optimize the purchase of a marketing media mix on web channels based on evolving quality trends in historical data, or recommend new pricing and strategies for display media bidding based on a difference between original pricing assumptions and a most recent quality and bid performance.

Figure 10:
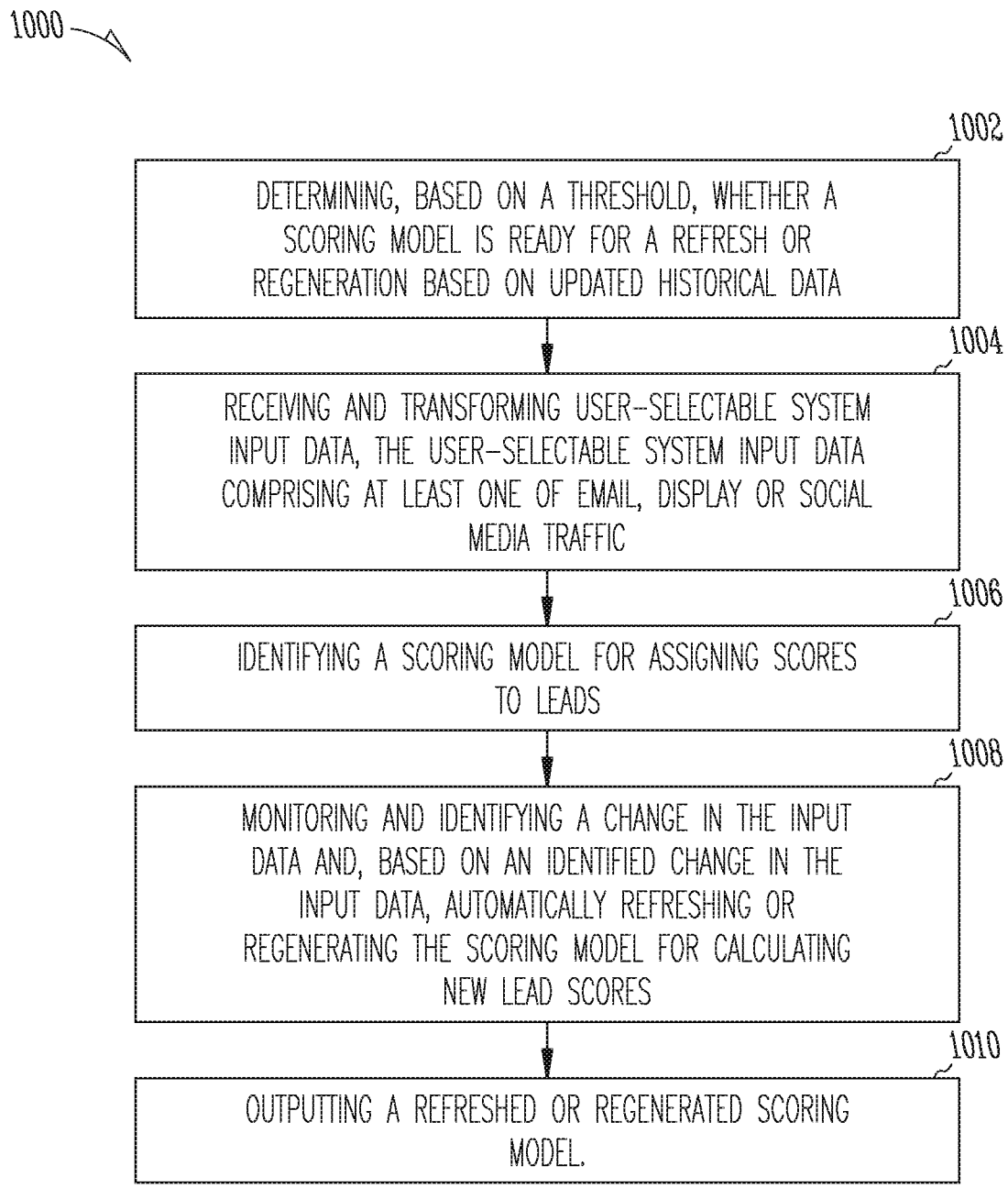
FIG. 10 is a flow chart showing some operations of a method for adaptive real time modeling and scoring, in accordance with an example embodiment.

Further aspects of the disclosed subject matter include methods. Once such method is disclosed in FIG. 10. A method 1000 for adaptive real time modeling and scoring may comprise: at 1002, determining, based on a threshold or trigger, for example a trigger such as a detection of new significant relationships in historic or recent data, whether a predictive scoring model is ready for a refresh or regeneration; at 1004, receiving and transforming user-selectable system input data, the user-selectable system input data comprising at least one of email, display or social media traffic; at 1006, (optional) identifying for the predictive scoring model a scoring model for assigning scores to leads; at 1008, monitoring and identifying a change in the input data and, based on an identified change in the input data, automatically refreshing or regenerating the scoring model for calculating new lead scores; and, at 1010, outputting a refreshed or regenerated scoring model.

In some examples, method 1000 may further comprise receiving an input defining a user profile of an existing target user and, based on the received user profile, generating a look-alike audience comprising potential target users replicating at least in part aspects of the user profile.

The method 1000 may further comprise providing a look-alike audience creator, the look-alike audience creator including an interactive user interface for receiving user selections relating to at least some aspects of the user profile. Still further, the method 1000 may further comprise using the interactive user interface to receive a selection of a degree of replication accuracy or population size of the look-alike audience. In one example, the received user profile is based at least in part on the user-selectable input data.

In some examples, the method 1000 further comprises using the refreshed or regenerated model to personalize conversation for in-bound calls at a call center, or optimize the purchase of a marketing media mix on web channels based on evolving quality trends in historical data, or recommend new pricing and strategies for display media bidding based on a difference between original pricing assumptions and a most recent quality and bid performance.

Figure 11:
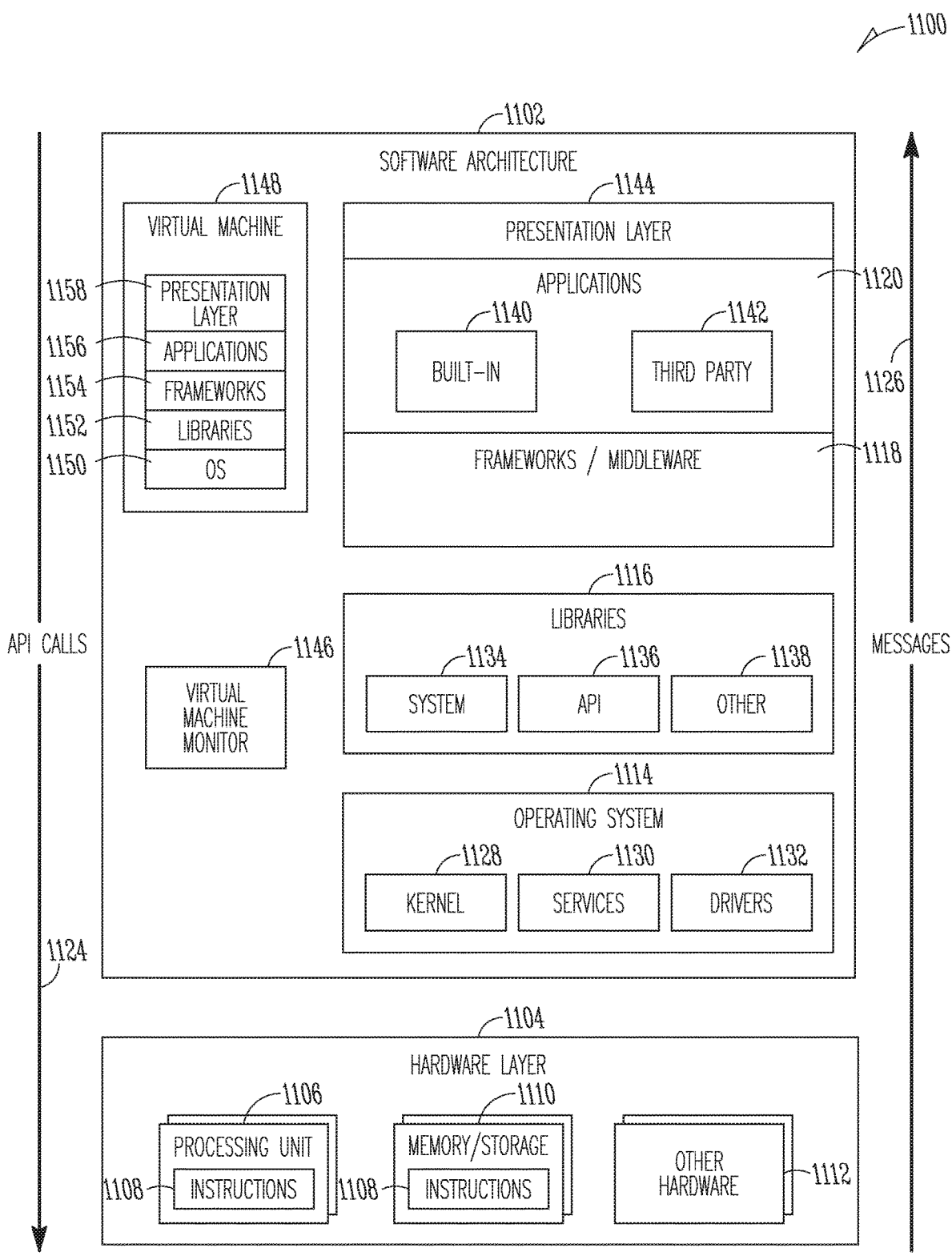
FIG. 11 is a block diagram showing one example of a software architecture for a computing device.

FIG. 11 is a block diagram 1100 showing one example of a software architecture 1102 for a computing device. The architecture 1102 may be used in conjunction with various hardware architectures, for example, as described herein. FIG. 11 is merely a non-limiting example of a software architecture and many other architectures may be implemented to facilitate the functionality described herein. A representative hardware layer 1104 is illustrated and may represent, for example, any of the above referenced computing devices.

The representative hardware layer 1104 comprises one or more processing units 1106 having associated executable instructions 1108. Executable instructions 1108 represent the executable instructions of the software architecture 1102, including implementation of the methods, components, and so forth described herein. Hardware layer 1104 also includes memory and/or storage components 1110, which also have executable instructions 1108. Hardware layer 1104 may also comprise other hardware as indicated by 1112 which represents any other hardware of the hardware layer 1104, such as the other hardware shown in FIG. 12 below.

In the example architecture of FIG. 11, the software 1102 may be conceptualized as a stack of layers where each layer provides particular functionality. For example, the software 1102 may include layers such as an operating system 1114, libraries 1116, frameworks/middleware 1118, applications 1120 and presentation layer 1144. Operationally, the applications 1120 and/or other components within the layers may invoke application programming interface (API) calls 1124 through the software stack and receive a response, returned values, and so forth illustrated as messages 1126 in response to the API calls 1124. The layers illustrated are representative in nature and not all software architectures have all layers. For example, some mobile or special purpose operating systems may not provide a frameworks/middleware layer 1118, while others may provide such a layer. Other software architectures may include additional or different layers.

The operating system 1114 may manage hardware resources and provide common services. The operating system 1114 may include, for example, a kernel 1128, services 1130, and drivers 1132. The kernel 1128 may act as an abstraction layer between the hardware and the other software layers. For example, the kernel 1128 may be responsible for memory management, processor management (e.g., scheduling), component management, networking, security settings, and so on. The services 1130 may provide other common services for the other software layers. The drivers 1132 may be responsible for controlling or interfacing with the underlying hardware. For instance, the drivers 1132 may include display drivers, camera drivers, Bluetooth® drivers, flash memory drivers, serial communication drivers (e.g., Universal Serial Bus (USB) drivers), Wi-Fi® drivers, NFC drivers, audio drivers, power management drivers, and so forth depending on the hardware configuration.

The libraries 1116 may provide a common infrastructure that may be utilized by the applications 1120 and/or other components and/or layers. The libraries 1116 typically provide functionality that allows other software modules to perform tasks in an easier fashion than to interface directly with the underlying operating system 1114 functionality (e.g., kernel 1128, services 1130 and/or drivers 1132). The libraries 1116 may include system 1134 libraries (e.g., C standard library) that may provide functions such as memory allocation functions, string manipulation functions, mathematic functions, and the like. In addition, the libraries 1116 may include API libraries 1136 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 9D in a graphic content on a display), database libraries (e.g., SQLite that may provide various relational database functions), web libraries (e.g., WebKit that may provide web browsing functionality), and the like. The libraries 1116 may also include a wide variety of other libraries 1138 to provide many other APIs to the applications 1120 and other software components/modules.

The frameworks 1118 (also sometimes referred to as middleware) may provide a higher-level common infrastructure that may be utilized by the applications 1120 and/or other software components/modules. For example, the frameworks 1118 may provide various graphic user interface (GUI) functions, high-level resource management, high-level location services, and so forth. The frameworks 1118 may provide a broad spectrum of other APIs that may be utilized by the applications 1120 and/or other software components/modules, some of which may be specific to a particular operating system or platform.

The applications 1120 includes built-in applications 1140 and/or third party applications 1142. Examples of representative built-in applications 1140 may include, but are not limited to, a contacts application, a browser application, a book reader application, a location application, a media application, a messaging application, and/or a game application. Third party applications 1142 may include any of the built in applications as well as a broad assortment of other applications. In a specific example, the third party application 1142 (e.g., an application developed using the Android™ or iOS™ software development kit (SDK) by an entity other than the vendor of the particular platform) may be mobile software running on a mobile operating system such as iOS™, Android™, Windows® Phone, or other mobile operating systems. In this example, the third party application 1142 may invoke the API calls 1124 provided by the mobile operating system such as operating system 1114 to facilitate functionality described herein.

The applications 1120 may utilize built in operating system functions (e.g., kernel 1128, services 1130 and/or drivers 1132), libraries (e.g., system 1134, APIs 1136, and other libraries 1138), frameworks/middleware 1118 to create user interfaces to interact with users of the system. Alternatively, or additionally, in some systems interactions with a user may occur through a presentation layer, such as presentation layer 1144. In these systems, the application/module "logic" may be separated from the aspects of the application/module that interact with a user.

Some software architectures utilize virtual machines. In the example of FIG. 11, this is illustrated by virtual machine 1148. A virtual machine creates a software environment where applications/modules may execute as if they were executing on a hardware computing device. A virtual machine is hosted by a host operating system (operating system 1114) and typically, although not always, has a virtual machine monitor 1146, which manages the operation of the virtual machine as well as the interface with the host operating system (i.e., operating system 1114). A software architecture executes within the virtual machine such as an operating system 1150, libraries 1152, frameworks/middleware 1154, applications 1156 and/or presentation layer 1158. These layers of software architecture executing within the virtual machine 1148 may be the same as corresponding layers previously described or may be different.

Figure 12:
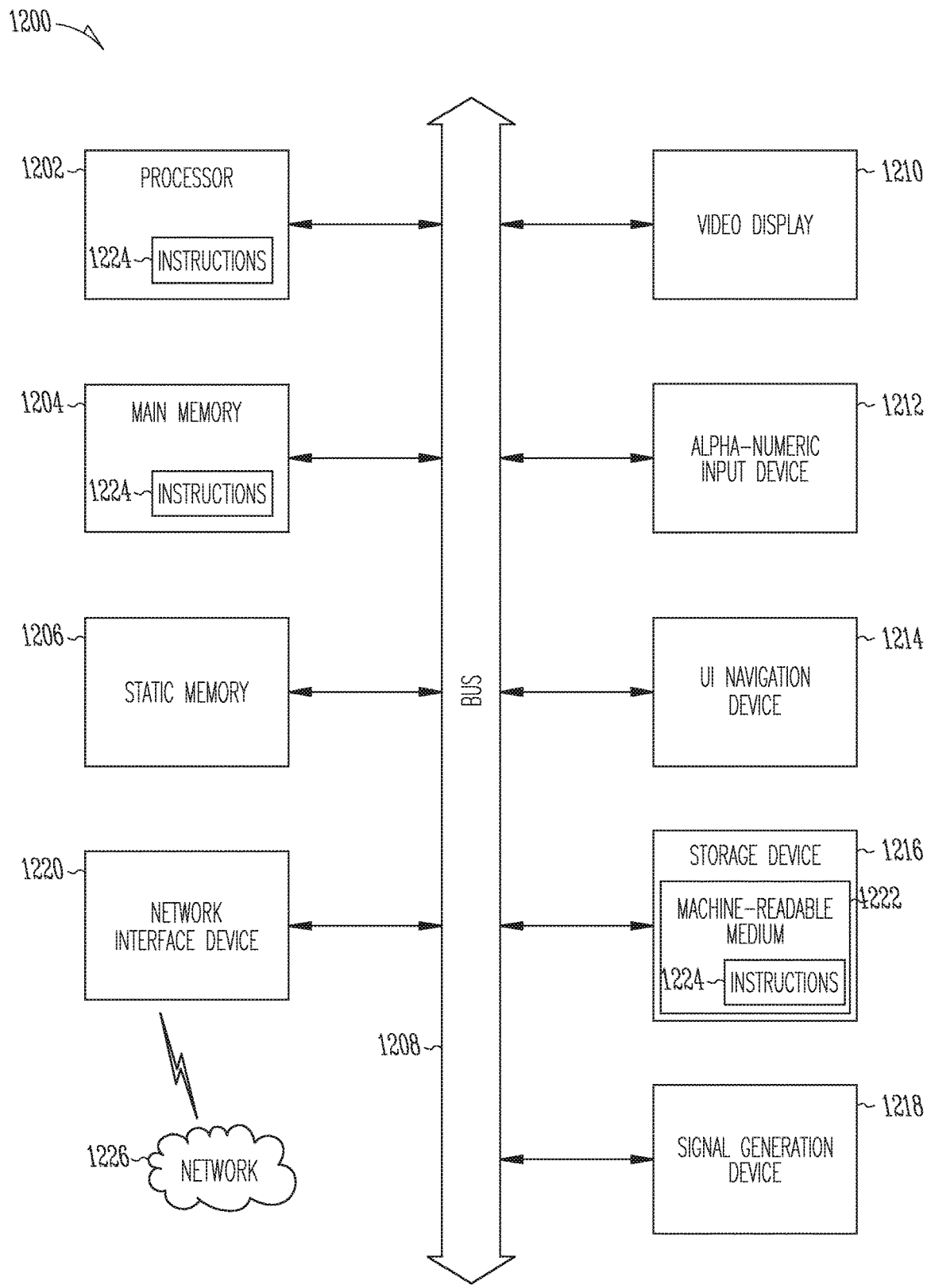
FIG. 12 is a block diagram illustrating a computing device hardware architecture, within which a set or sequence of instructions may be executed to cause the machine to perform examples of any one of the methodologies discussed herein.

FIG. 12 is a block diagram illustrating a computing device hardware architecture 1200, within which a set or sequence of instructions may be executed to cause the machine to perform examples of any one of the methodologies discussed herein. For example, the architecture 1200 may execute the software architecture 1102 described with respect to FIG. 11. The architecture 1200 may operate as a standalone device or may be connected (e.g., networked) to other machines. In a networked deployment, the architecture 1200 may operate in the capacity of either a server or a client machine in server-client network environments, or it may act as a peer machine in peer-to-peer (or distributed) network environments. The architecture 1200 may be implemented in a personal computer (PC), a tablet PC, a hybrid tablet, a set-top box (STB), a personal digital assistant (PDA), a mobile telephone, a web appliance, a network router, switch or bridge, or any machine capable of executing instructions (sequential or otherwise) that specify actions to be taken by that machine.

Example architecture 1200 includes a processor unit 1202 comprising at least one processor (e.g., a central processing unit (CPU), a graphics processing unit (GPU) or both, processor cores, compute nodes, etc.). The architecture 1200 may further comprise a main memory 1204 and a static memory 1206, which communicate with each other via a link 1208 (e.g., bus). The architecture 1200 may further include a video display unit 1210, an alphanumeric input device 1212 (e.g., a keyboard), and a user interface (UI) navigation device 1214 (e.g., a mouse). In some examples, the video display unit 1210, input device 1212 and UI navigation device 1214 are incorporated into a touch screen display. The architecture 1200 may additionally include a storage device 1216 (e.g., a drive unit), a signal generation device 1218 (e.g., a speaker), a network interface device 1220, and one or more sensors (not shown), such as a global positioning system (GPS) sensor, compass, accelerometer, or other sensor.

The storage device 1216 includes a machine-readable medium 1222 on which is stored one or more sets of data structures and instructions 1224 (e.g., software) embodying or utilized by any one or more of the methodologies or functions described herein. The instructions 1224 may also reside, completely or at least partially, within the main memory 1204, static memory 1206, and/or within the processor 1202 during execution thereof by the architecture 1200, with the main memory 1204, static memory 1206, and the processor 1202 also constituting machine-readable media. Instructions stored at the machine-readable medium 1222 may include, for example, instructions for implementing the software architecture 1002, instructions for executing any of the features described herein, etc.

While the machine-readable medium 1222 is illustrated in an example to be a single medium, the term "machine-readable medium" may include a single medium or multiple media (e.g., a centralized or distributed database, and/or associated caches and servers) that store the one or more instructions 1224. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 1224 may further be transmitted or received over a communications network 1226 using a transmission medium via the network interface device 1220 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, 3G, and 6G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Examples, as described herein, may include, or may operate on, logic or a number of components, engines, or modules, circuits, which for the sake of consistency are termed circuits, although it will be understood that these terms may be used interchangeably. Circuits may be hardware, software, or firmware communicatively coupled to one or more processors in order to carry out the operations described herein. Circuits may be hardware circuits, and as such circuits may be considered tangible entities capable of performing specified operations and may be configured or arranged in a certain manner. In an example, circuits may be arranged (e.g., internally or with respect to external entities such as other circuits) in a specified manner as a circuit. In an example, the whole or part of one or more computing platforms (e.g., a standalone, client or server computing platform) or one or more hardware processors may be configured by firmware or software (e.g., instructions, an application portion, or an application) as a circuit that operates to perform specified operations. In an example, the software may reside on a machine-readable medium. In an example, the software, when executed by the underlying hardware of the circuit, causes the hardware to perform the specified operations. Accordingly, the term hardware circuit is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein.

Considering examples in which circuits are temporarily configured, each of the circuits need not be instantiated at any one moment in time. For example, where the circuits comprise a general-purpose hardware processor configured using software; the general-purpose hardware processor may be configured as respective different circuits at different times. Software may accordingly configure a hardware processor, for example, to constitute a particular circuit at one instance of time and to constitute a different circuit at a different instance of time.

The above detailed description includes references to the accompanying drawings, which form a part of the detailed description. The drawings show, by way of illustration, specific examples that may be practiced. These examples are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other examples may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as examples may feature a subset of said features. Further, examples may include fewer features than those disclosed in a particular example. Thus, the following claims are hereby incorporated into the Detailed Description, with a claim standing on its own as a separate example. The scope of the examples disclosed herein is to be determined with reference to the appended claims, along with the full scope of equivalents to which such claims are entitled.

What is claimed is:

1. An adaptive real time modeling and scoring system for generating predictive scoring models, the system comprising:
   one or more processors; and
   a memory coupled to the one or more processors which stores processor-executable instructions which, when executed by the one or more processors, cause the one or more processors to:
   generate multiple predictive scoring models;
   identify a consolidated trigger for a combination of the multiple predictive scoring models;
   evaluate the multiple predictive scoring models based on a heuristic to select an optimal predictive scoring model;
   determine, based on the consolidated trigger, that the optimal predictive scoring model is ready for a refresh;
   transform user-selectable system input data comprising elements of a plurality of consumer profiles including one or more of a plurality of email traffic, display traffic and social media traffic;
   identify a change in the system input data and refresh the predictive scoring model based on the identified change in system input data, the refreshed predictive scoring model for calculating new lead scores indicating a probability that the new leads will make a purchase; and
   use the refreshed predictive scoring model to recommend new pricing and strategies for display media bidding.

2. The system of claim 1, wherein the processor-executable instructions, when executed, further cause the one or more processors to receive an input defining a consumer profile of an existing target consumer and, based on the received consumer profile, generate a look-alike audience comprising potential target consumers replicating at least in part aspects of the consumer profile.

3. The system of claim 2, wherein the processor-executable instructions, when executed, further cause the one or more processors to receive user selections relating to at least some aspects of the consumer profile with an interactive user interface.

4. The system of claim 3, wherein the processor-executable instructions, when executed, further cause the one or more processors to receive a selection of a degree of replication accuracy or population size of the look-alike audience with a consumer element of the interactive user interface.

5. The system of claim 3, wherein the received consumer profile is based at least in part on the user-selectable system input data.

6. The system of claim 1, wherein the trigger is a forced trigger.

7. The system of claim 1, wherein the trigger is an automated trigger that is based on analysis of historical data and new data that reveals a new relationship between different variables that did not exist previously.

8. The system of claim 1, wherein the processor-executable instructions, when executed, further cause the one or more processors to use the refreshed predictive scoring model to optimize the purchase of a marketing media.

9. A method for performing adaptive real time modeling and scoring, the method comprising, at least:
   generating multiple predictive scoring models;
   identifying a consolidated trigger for a combination of the multiple predictive scoring models;
   evaluating the multiple predictive scoring models based on a heuristic to select an optimal predictive scoring model;
   determining, based on the consolidated trigger, that the optimal predictive scoring model is ready for a refresh;
   transforming user-selectable system input data comprising elements of a plurality of consumer profiles including one or more of a plurality of email traffic, display traffic and social media traffic;
   identifying a change in the system input data and refreshing the predictive scoring model based on the identified change in system input data, the refreshed predictive scoring model for calculating new lead scores indicating a probability that the new leads will make a purchase; and
   using the refreshed predictive scoring model to recommend new pricing and strategies for display media bidding.

10. The method of claim 9, further comprising receiving an input defining a consumer profile of an existing target consumer and, based on the received consumer profile, generating a look-alike audience comprising potential target consumers replicating at least in part aspects of the consumer profile.

11. The method of claim 10, further comprising providing a look-alike audience creator, the look-alike audience creator including an interactive user interface for receiving user selections relating to at least some aspects of the consumer profile.

12. The method of claim 11, further comprising using the interactive user interface to receive a selection of a degree of replication accuracy or population size of the look-alike audience.

13. The method of claim 12, wherein the received consumer profile is based at least in part on the user-selectable system input data.

14. The method of claim 9, further comprising using the refreshed predictive scoring model to optimize the purchase of a marketing media.

15. A machine-readable medium comprising instructions which, when read by a machine, cause the machine to perform operations comprising, at least:
   generating multiple predictive scoring models;
   identifying a consolidated trigger for a combination of the multiple predictive scoring models;
   evaluating the multiple predictive scoring models based on a heuristic to select an optimal predictive scoring model;
   determining, based on the consolidated trigger, that the optimal predictive scoring model is ready for a refresh;
   transforming user-selectable system input data comprising elements of a plurality of consumer profiles including one or more of a plurality of email traffic, display traffic and social media traffic;
   identifying a change in the system input data and refreshing the predictive scoring model based on the identified change in system input data, the refreshed predictive scoring model for calculating new lead scores indicating a probability that the new leads will make a purchase; and using the refreshed predictive scoring model to recommend new pricing and strategies for display media bidding.

16. The system of claim 1, wherein the refreshed predictive scoring model includes a look-alike audience that may produce a range of look-alike segments having one or more predefined attributes or behaviors.

17. The system of claim 1, wherein the processor-executable instructions, when executed, further cause the one or more processors to:

determine an equation including multiple predictive factors weighted by an importance of each predictive factor in predicting a likelihood of a lead to convert; and change at least one weight of a predictive factor to adapt the refreshed predictive scoring model to include a quality classification for a publisher.

18. The method of claim 9, wherein the refreshed predictive model includes a look-alike audience that may produce a range of look-alike segments having one or more predefined attributes or behaviors.

19. The method of claim 9, further comprising determining an equation including multiple predictive factors weighted by an importance of each predictive factor in predicting a likelihood of a lead to convert; and changing at least one weight of a predictive factor to adapt the refreshed predictive scoring model to include a quality classification for a publisher.

20. The medium of claim 15, wherein the refreshed predictive scoring model includes a look-alike audience that may produce a range of look-alike segments having one or more predefined attributes or behaviors.

* * * * *